US007489758B2

(12) United States Patent
Lan

(10) Patent No.: US 7,489,758 B2
(45) Date of Patent: Feb. 10, 2009

(54) SHIFT REGISTER APPARATUS AND SHIFT REGISTER THEREOF

(75) Inventor: Gen-Chi Lan, Taoyuan County (TW)

(73) Assignee: Hannstar Display Corporation, Tao-Yuan Hsien (TW)

(*) Notice: Subject to any disclaimer, the term of this patent is extended or adjusted under 35 U.S.C. 154(b) by 0 days.

(21) Appl. No.: 11/758,993

(22) Filed: Jun. 6, 2007

(65) Prior Publication Data

US 2008/0253501 A1 Oct. 16, 2008

(30) Foreign Application Priority Data

Apr. 16, 2007 (TW) .............................. 96113308 A

(51) Int. Cl.
*G11C 19/00* (2006.01)
(52) U.S. Cl. .......................................... 377/64; 377/72
(58) Field of Classification Search .................. None
See application file for complete search history.

(56) References Cited

U.S. PATENT DOCUMENTS

| 3,829,711 | A | * | 8/1974 | Crowle ......................... 377/79 |
| 4,538,288 | A | * | 8/1985 | Soneda et al. .................. 377/76 |
| 7,145,545 | B2 | * | 12/2006 | Zebedee et al. ............. 345/100 |

* cited by examiner

*Primary Examiner*—Cassandra Cox
(74) *Attorney, Agent, or Firm*—J.C. Patents

(57) ABSTRACT

A shift register apparatus and a shift register thereof are provided. The shift register includes an input unit, a feedback unit, an output unit, and a reset unit. The shift register is made of MOS transistors, BJTs, or other switching transistors. In the present invention, an input signal is registered and shifted through specific couplings between foregoing units with two clock signals having different pulse durations.

26 Claims, 7 Drawing Sheets

US 7,489,758 B2

SHIFT REGISTER APPARATUS AND SHIFT REGISTER THEREOF

CROSS-REFERENCE TO RELATED APPLICATION

This application claims the priority benefit of Taiwan application serial no. 96113308, filed Apr. 16, 2007. All disclosure of the Taiwan application is incorporated herein by reference.

BACKGROUND OF THE INVENTION

1. Field of the Invention

The present invention generally relates to a driving apparatus, in particular, to a shift register apparatus and a shift register thereof in a driving apparatus.

2. Description of Related Art

FIG. 1 illustrates a conventional shift register, namely, a Thomson circuit, in a driving apparatus. The shift register includes NMOS (N-type metal oxide semiconductor) transistors 102~108 and capacitors 110 and 112. The "IN", "OUT", "RES", and "COM" respectively represent an input signal, an output signal, a reset signal, and a common voltage, and the "CLK1" and "CLK2" respectively represent two different clock signals.

The input signal IN is a pulse signal. The pulse enable durations of the input signal IN and the clock signal CLK1 are the same, and the pulse enable durations of the clock signals CLK1 and CLK2 are different. When the clock signal CLK1 is at a high voltage level and the clock signal CLK2 is at a low voltage level, the shift register sustains the gate voltage of the NMOS transistor 104 with the capacitors 110 and 112 in order to maintain the turned-on status of the NMOS transistor 104, so that the output signal OUT can be output when the clock signal CLK2 is turned to a high voltage level.

FIG. 2 illustrates a conventional shift register apparatus. The shift register apparatus is broadly applied to liquid crystal displays (LCDs), for example, as the gate driver in a LCD. Referring to FIG. 2, the shift register apparatus includes shift registers 201~N+1 as illustrated in FIG. 1. In FIG. 2, "IN" represents an input signal, OUT(1)~OUT(N) respectively represent the output signals of the shift registers 201~N, and "CLKS1" and "CLKS2" respectively represent two different clock signals. In each shift register, "IP" denotes the input terminal of the circuit in FIG. 1 for receiving the input signal IN, "RP" denotes the input terminal of the circuit in FIG. 1 for receiving the reset signal RES, "CLK1P" denotes the input terminal of the circuit in FIG. 1 for receiving the clock signal CLK1, and "CLK2P" denotes the input terminal of the circuit in FIG. 1 for receiving the clock signal CLK2.

In such a shift register apparatus, the reset signal of each shift register is the output signal of the next shift register. Accordingly, N+1 shift registers are required even though only N output signals are provided in the shift register apparatus.

As described above, the shift register apparatus described above has to use an extra shift register, therefore the size thereof is large and the fabrication cost thereof is high.

SUMMARY OF THE INVENTION

Accordingly, the present invention is directed to a shift register apparatus using shift registers in the present invention. The shift register apparatus does not require an extra shift register therefore both the size and the fabrication cost thereof are reduced.

The present invention is directed to a shift register including an input unit, an output unit, a feedback unit, and a reset unit. The input unit receives an input signal and a first clock signal, and outputs the input signal according to the first clock signal. The output unit receives a second clock signal and the input signal from the input unit, and outputs the second clock signal to an output terminal according to the input signal. The feedback unit receives the second clock signal and the input signal from the input unit, and outputs the signal at the output terminal to the output unit according to the second clock signal. The reset unit receives a reset signal and couples the output terminal to a low voltage signal according to the reset signal.

The present invention provides a shift register including a first switch, a second switch, a third switch, a fourth switch, a fifth switch, an input terminal, and an output terminal. Each of the switches has a first terminal, a second terminal, and a control terminal. The input terminal is connected to the first terminal of the first switch. The output terminal is connected to the first terminal of the second switch, the first terminal of the fourth switch, and the second terminal of the third switch. The second terminal of the first switch, the control terminal of the second switch, and the first terminal of the third switch are connected to each other, the second terminal of the second switch is connected to the control terminal of the third switch, and the control terminal of the first switch is connected to the control terminal of the fourth switch.

The present invention provides a shift register apparatus including a first shift register and a second shift register. The first shift register includes a first input terminal, a first output terminal, a first reset terminal, a first control terminal, and a second control terminal. The second shift register includes a second input terminal, a second output terminal, a second reset terminal, a third control terminal, and a fourth control terminal. The first output terminal is electrically connected to the second input terminal, the first control terminal and the fourth control terminal are both coupled to a first clock signal, and the second control terminal and the third control terminal are both coupled to a second clock signal.

According to an embodiment of the present invention, in the shift register described above, the control terminals of the first and the fourth switch are coupled to a first signal, and the second terminal of the second switch and the control terminal of the third switch are coupled to a second signal. The second terminals of the fourth and the fifth switch are coupled to a low voltage signal, and the first terminal of the fifth switch is connected to the output terminal and the first terminal of the second switch, the first terminal of the fourth switch, and the second terminal of the third switch.

According to an embodiment of the present invention, in the shift register described above, the input signal is a pulse signal, the pulse enable durations of the pulse signal and the first clock signal are the same, the pulse enable durations of the first and the second clock signal are different, and the pulse duration of the reset signal is between the pulse durations of the first and the second clock signal.

According to an embodiment of the present invention, in the shift register described above, the reset signal is the first clock signal.

According to an embodiment of the present invention, in the shift register described above, the input signal is a pulse signal, the pulse enable durations of the pulse signal and the first signal are the same, the pulse enable durations of the first and the second signal are different, and the pulse duration of the reset signal is between the pulse durations of the first and the second signal.

According to an embodiment of the present invention, in the shift register described above, the reset signal is the first signal.

According to an embodiment of the present invention, in the shift register described above, the input unit, output unit, feedback unit, and reset unit are respectively made of a thin film transistor (TFT), a NMOS and a PMOS, or BJTs. As well as the first, second, third, fourth, and fifth switches.

According to an embodiment of the present invention, the first shift register in the shift register apparatus is a shift register described above.

In the present invention, a shift register comprises several transistors, such as MOS transistors, or several units where each unit may include at least one switch device, and an input signal is shifted through the specific parasitic capacitance and coupling effects of the foregoing units or the switch devices with two clock signals having different pulse durations. In addition, in the present invention, a shift register apparatus has a plurality of shift registers provided by the present invention, and the pulse duration of a reset signal required by the shift registers is located between the pulse durations of the two clock signals or one of the clock signals is used as the reset signal so that the only the same number of shift registers as the number of the output signals in the shift register apparatus are used in the present invention, and accordingly both the size and fabrication cost thereof are improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
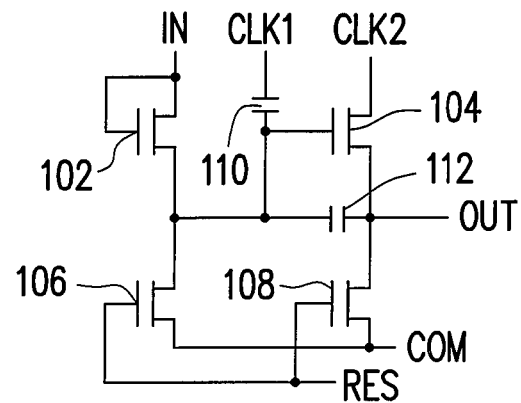
FIG. 1 illustrates a conventional shift register.
Figure 2:
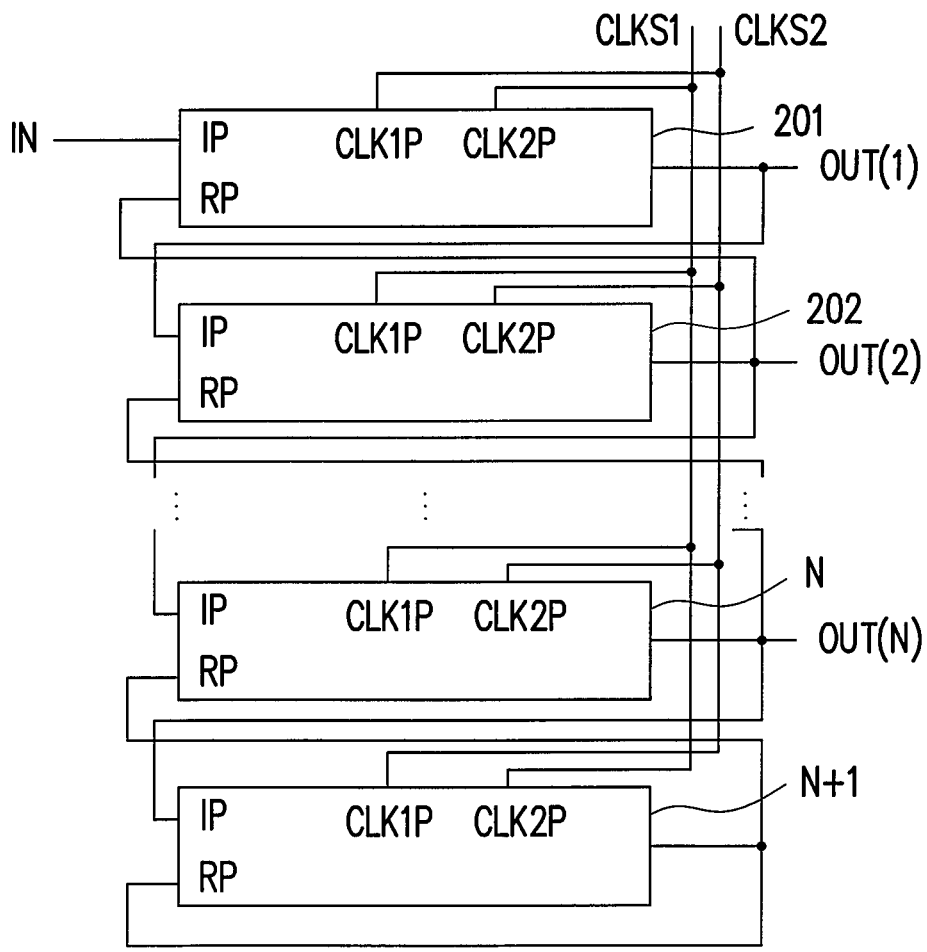
FIG. 2 illustrates a conventional shift register apparatus.

Reference will now be made in detail to the present preferred embodiments of the invention, examples of which are illustrated in the accompanying drawings. Wherever possible, the same reference numbers are used in the drawings and the description to refer to the same or like parts.

Figure 3:
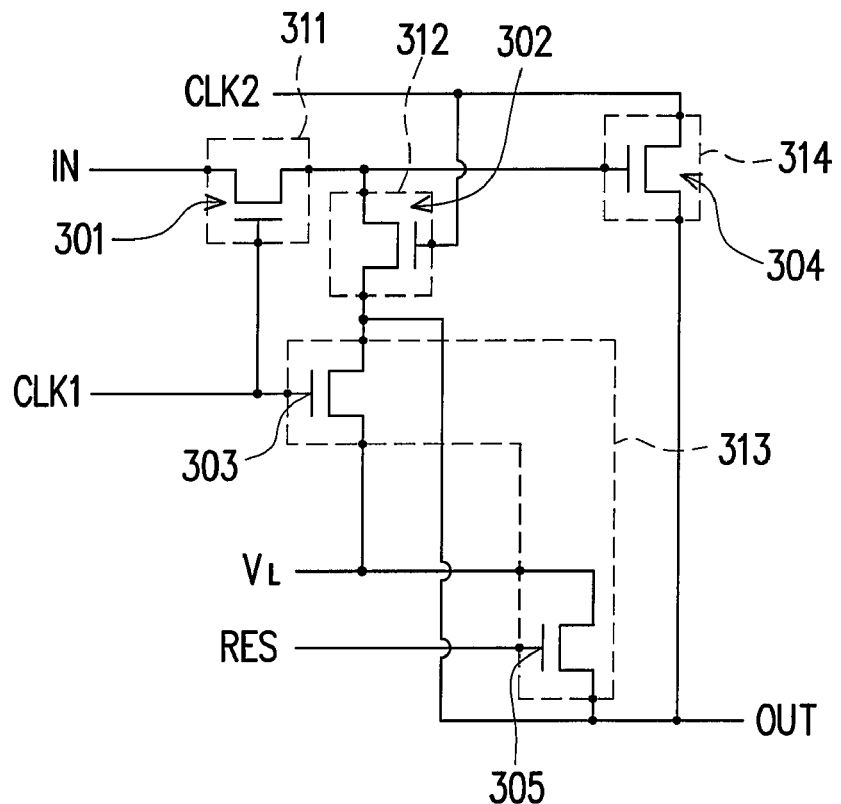
FIG. 3 illustrates a shift register according to a first embodiment of the present invention.

FIG. 3 illustrates a shift register according to a first embodiment of the present invention. The shift register includes an input unit 311, a feedback unit 312, a reset unit 313, and an output unit 314. In the present embodiment, each unit is composed of at least one switch, for example, the input unit 311 includes a switch 301, the feedback unit 312 includes a switch 302, the reset unit 313 includes switches 303 and 305, and the output unit 314 includes a switch 304. Each of the switches 301~305 has a first terminal, a second terminal, and a control terminal, and each these switches is turned on/off according to the signal received by the control terminal thereof.

The first terminal of the switch 301 in the input unit 311 receives an input signal IN, the control terminal thereof receives a clock signal CLK1 (i.e. the first signal), and the input unit 311 transmits the input signal IN to the second terminal thereof according to the clock signal CLK1. The first terminal of the switch 304 in the output unit 314 receives a clock signal CLK2 (i.e. the second signal), the second terminal thereof outputs an output signal OUT, the control terminal thereof is coupled to the second terminal of the switch 301, and the output unit 314 outputs the clock signal CLK2 to the second terminal thereof as the output signal OUT according to the input signal IN. The switch 304 can be designed appropriately, as such being designed in a bigger size, to sustain the voltage at the control terminal thereof at least until the clock signal CLK2 is turned to a high voltage level. The first terminal of the switch 302 in the feedback unit 312 is coupled to the second terminal of the switch 301, the control terminal thereof receives the clock signal CLK2, and the feedback unit 312 feeds the output signal OUT received from the second terminal thereof back to the output unit 314 connected to the first terminal thereof according to the clock signal CLK2. The first terminal of the switch 303 in the reset unit 313 is coupled to the second terminal of the switch 302, the second terminal thereof is coupled to a low voltage signal $V_L$ (in the present embodiment, the low voltage signal $V_L$ is lower than or equal to the low voltage level of the clock signal CLK2), the control terminal thereof receives the clock signal CLK1, and the reset unit 313 resets the output signal OUT of the output unit 314 according to a reset signal RES. The first terminal of the switch 305 is coupled to the second terminal of the switch 304 and the first terminal of the switch 303, the second terminal thereof is also coupled to the low voltage signal $V_L$, and the control terminal thereof receives the reset signal RES. Besides, when the shift register is applied to a driving apparatus of a liquid crystal display (LCD), the reset signal RES may be an output enable (OE) signal, and the switch 305 resets the output signal OUT of the output unit 314 according to the reset signal RES. Moreover, when the shift register is applied to a driving apparatus of a LCD, the low voltage signal $V_L$ may be a VL signal.

In the present embodiment, the switches 301~305 may be implemented with NMOS transistors, PMOS transistors, thin film transistors (TFTs), BJTs, or other switching devices. In addition, the implementations of the input unit 311, the feedback unit 312, the reset unit 313, and the output unit 314 are not limited to those illustrated in FIG. 3, while each unit may also be composed of multiple switches or any other circuit which can perform foregoing functions.

Figure 4:
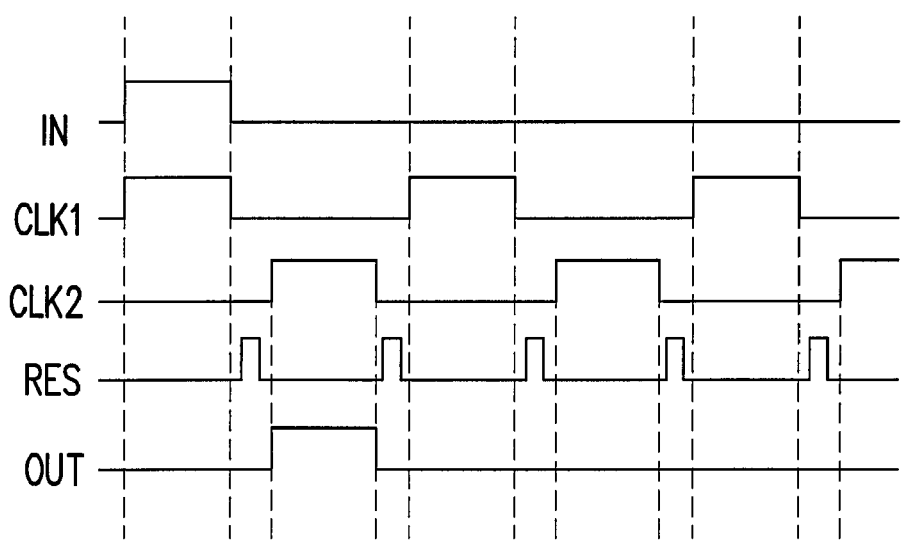
FIG. 4 is a timing diagram of various signals of the circuit in FIG. 3.

FIG. 4 is a timing diagram of various signals of the circuit in FIG. 3. The signals in FIG. 4 are respectively corresponding to those signals with same names in FIG. 3, wherein the input signal IN is a pulse signal having the same pulse enable duration with the clock signal CLK1, the pulse enable durations of the clock signals CLK1 and CLK2 are different, and the pulse duration of the reset signal RES is between the pulse durations of the clock signals CLK1 and CLK2. In other words, the duty cycles of both the clock signals CLK1 and CLK2 have to be smaller than 50% of system pulse cycle, and in the present embodiment, the duty cycles of the clock signals CLK1 and CLK2 are preferably smaller than 48.5% of system pulse cycle so that the pulse duration of the reset signal RES can be between the pulse durations of the clock signals CLK1 and CLK2. Besides, when the clock signals CLK1 and CLK2 have the same pulse width, the pulse width ratio of the reset signal RES to the clock signals CLK1 and CLK2 is preferably smaller than 0.03. In the present embodiment, the optimal operation timing is that the pulse width of the reset signal RES is 1.6μs, and the pulse width of the clock signals CLK1 and CLK2 is 63.5μs.

Referring to FIG. 3 and FIG. 4, when the input signal IN and the clock signal CLK1 are at a high voltage level and the clock signal CLK2 is at a low voltage level, the switches 301 and 303 are turned on, thus, the shift register samples the input signal IN by turning on the switch 301 with the clock signal CLK1, and the shift register couples the output terminal thereof to a low voltage signal $V_L$ in order to reset the output terminal thereof by using the switch 303, wherein the low voltage signal $V_L$ is lower than or equal to the low voltage level of the clock signal CLK2. Next, the clock signal CLK1 is turned to a low voltage level while the reset signal RES is turned to a high voltage level, and here the switch 305 is turned on so that the output terminal OUT of the output unit is coupled to the low voltage signal $V_L$ in order to further reset the output terminal OUT. Here the clock signal CLK2 remains its low voltage level, and the switch 304 stores the charges of the sampled input signal IN through its parasitic capacitance in order to sustain its gate voltage at least until the clock signal CLK2 is turned to a high voltage level. The sustained time is determined by the size of the transistor serving as the switch 304; therefore the size of the transistor serving as the switch 304 has to be large enough in order to sustain the turned-on status of the transistor until the clock signal CLK2 is turned to a high voltage level.

Thereafter, the clock signal CLK2 is turned to a high voltage level and the clock signal CLK1 and the reset signal RES are both at a low voltage level, and here since the switch 304 is still turned on, the output signal OUT is output. Meanwhile, the switch 302 in the feedback unit 312 is also turned on, thus, the output signal OUT is fed back to the control terminal of the switch 304 in the output unit 314 so that the switch 304 in the output unit 314 can output the output signal OUT completely.

Passive elements are reduced or avoided in the shift register provided by the present invention, and accordingly, the circuit size can be reduced. Moreover, another shift register having the same structure can be disposed with the extra space, when the origin shift register encounters problems, the other shift register can replaced the origin shift register.

Figure 5:
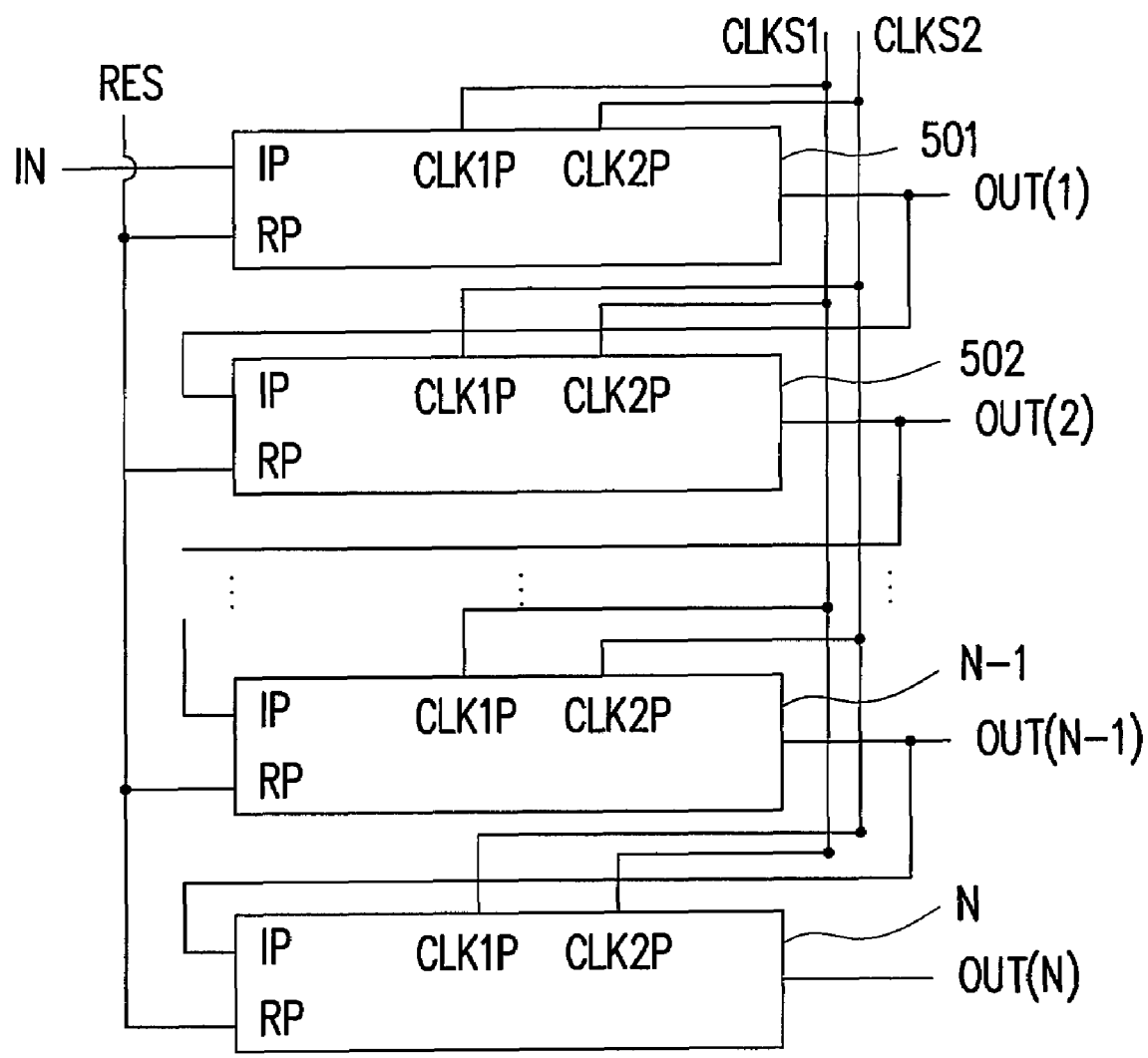
FIG. 5 illustrates a shift register apparatus according to an embodiment of the present invention.

As described above, a plurality of shift registers in the first embodiment may be used for constructing a shift register apparatus. FIG. 5 illustrates a shift register apparatus constructed with N shift registers in FIG. 3. In FIG. 5, IN represents an input signal, OUT(1)~OUT(N) respectively represent the output signals of the shift registers 501~N, CLKS1 and CLKS2 respectively represent two different clock signals and are connected to the CLK1P and CLK2P of each shift register in a staggered way, wherein CLK1P refers to the control terminal of the circuit in FIG. 3 for receiving the clock signal CLK1, and CLK2P refers to the control terminal of the circuit in FIG. 3 for receiving the clock signal CLK2. IP in each shift register represents the input terminal of the input unit in FIG. 3 for receiving the input signal IN, and RP represents to the reset terminal of the reset unit in FIG. 3 for receiving the reset signal RES. Accordingly, when a input signal IN at high voltage level is input to the $(N-1)^{th}$ shift register, a signal OUT(N-1) of high voltage level is output under the functions of two different clock signals CLKS1 and CLKS2 by the $(N-1)^{th}$ shift register after delaying a clock signal time. At the same time, the signal OUT(N-1) becomes the input signal for the $N^{th}$ shift register, and then the signal OUT(N-1) is reset to a low voltage signal by the reset signal RES. Similarly, when an input signal IN of high voltage level is input to the $Nf^{th}$ shift register, a signal OUT(N) of high voltage level is output from the $N^{th}$ shift register after delaying a clock signal time, and then the signal OUT(N) is reset to a low voltage signal by the reset signal RES.

Figure 6:
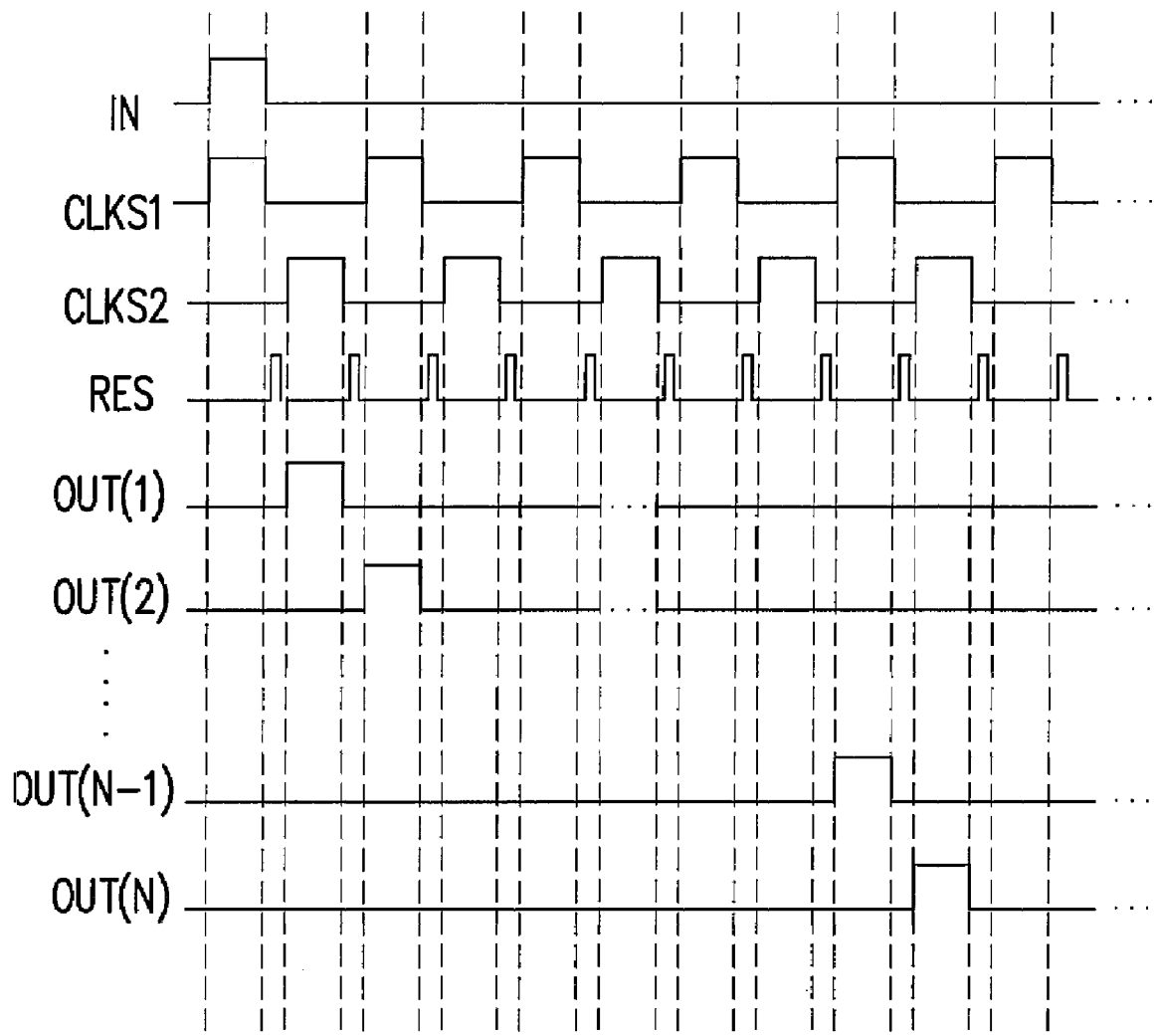
FIG. 6 is a timing diagram of various signals of the circuit in FIG. 3 when it is applied in the shift register apparatus in FIG. 5.

FIG. 6 is a timing diagram of various signals in the circuit in FIG. 3 when the circuit in FIG. 3 is applied to the shift register apparatus in FIG. 5, wherein the signals in FIG. 6 are respectively corresponding to those signals having the same names in FIG. 5. It was mentioned above that the duty cycles of both the clock signals CLKS1 and CLKS2 have to be smaller than 50% of system pulse cycle so that the pulse duration of the reset signal RES can be located between the pulse durations of the clock signals CLKS1 and CLKS2. Besides, as shown in FIG. 5, every shift register uses the same reset signal RES. Accordingly, a N-level shift register apparatus needs only N shift registers, and an extra shift register for providing the reset signal of the $N^{th}$ shift register becomes unnecessary.

Figure 7:
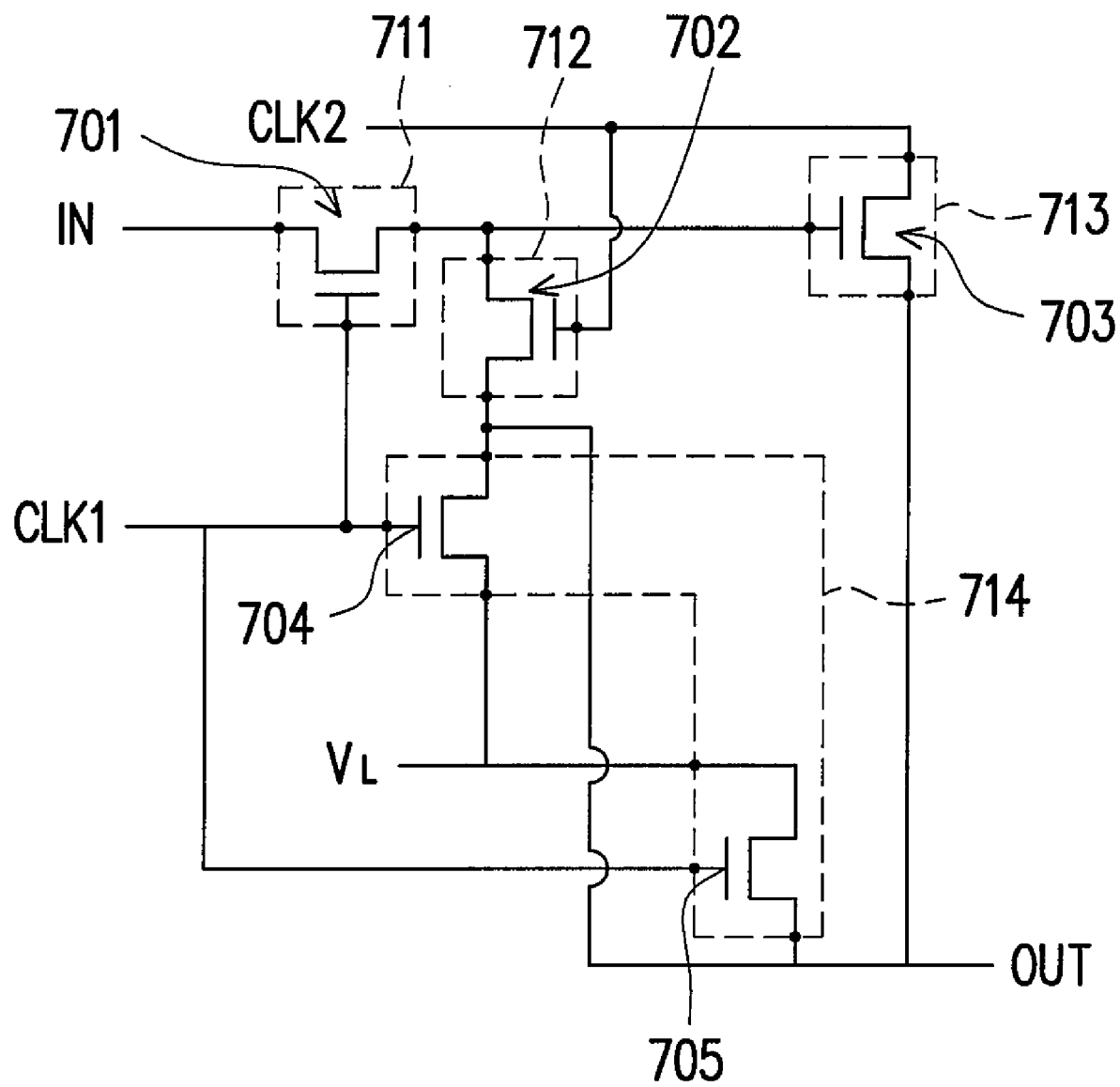
FIG. 7 illustrates a shift register according to a second embodiment of the present invention.

Based on the description of FIG. 3, a variation of the shift register in FIG. 3 can be obtained and which does not require the reset signal RES for shifting a signal. FIG. 7 illustrates a shift register according to a second embodiment of the present invention. It can be observed by comparing the circuits in FIG. 3 and FIG. 7 that only the signal received by the control terminal of the switch 305 is changed in FIG. 7, namely, the original reset signal RES is changed to the clock signal CLK1 to form a reset unit 714.

Figure 8:
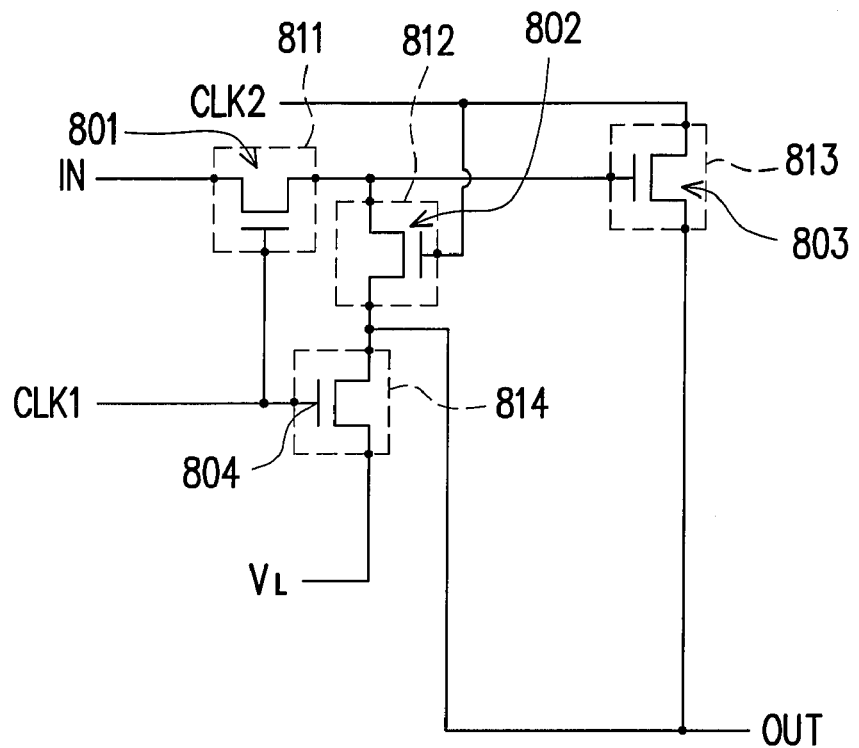
FIG. 8 illustrates a shift register according to a third embodiment of the present invention.
Figure 9:
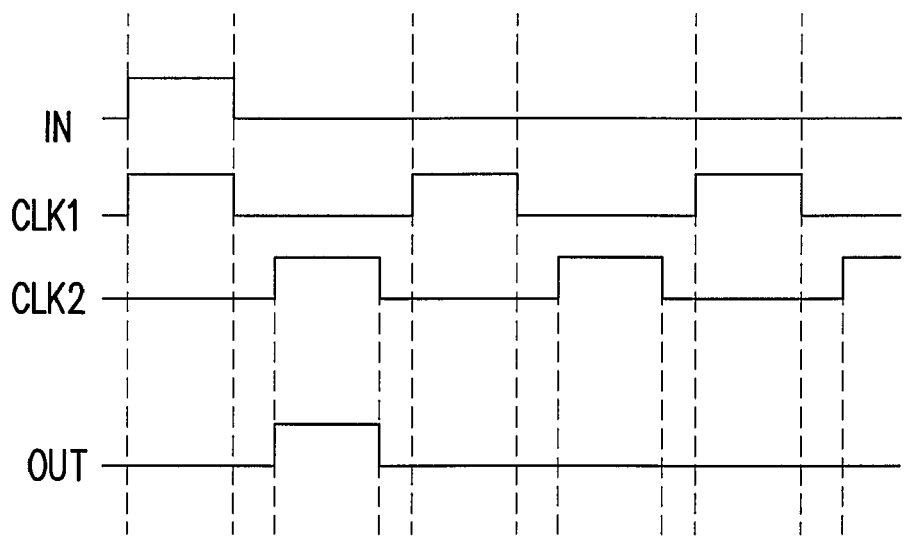
FIG. 9 is a timing diagram of various signals of the circuits in FIGS. 7 and 8.

FIG. 8 illustrates a shift register according to a third embodiment of the present invention. It can be observed by comparing the circuits in FIG. 7 and FIG. 8 that the reset unit 714 in FIG. 7 is simplified and the switch 705 is removed to form a reset unit 814 in FIG. 8. The circuits in FIG. 7 and FIG. 8 can perform signal shifting by using only the clock signals CLK1 and CLK2 since they only use a clock signal CLK1 for resetting the output terminals thereof. In addition, referring to the descriptions of the first, second, and third embodiments of the present invention, the reset signal RES may be different signals. Similarly, in another embodiment of the present invention, the control terminals of the switches 305 and 705 in the reset units of the first and second embodiments of the present invention may also be coupled to another reset signal but not to the clock signal CLK1, wherein the pulse enable duration of the reset signal may be designed as the same as that of the clock signal CLK1. FIG. 9 is a timing diagram of various signals of the circuits in FIGS. 7 and 8, and the signals in FIG. 9 are respectively corresponding to those signals having the same names in FIG. 7 and FIG. 8.

Figure 10:
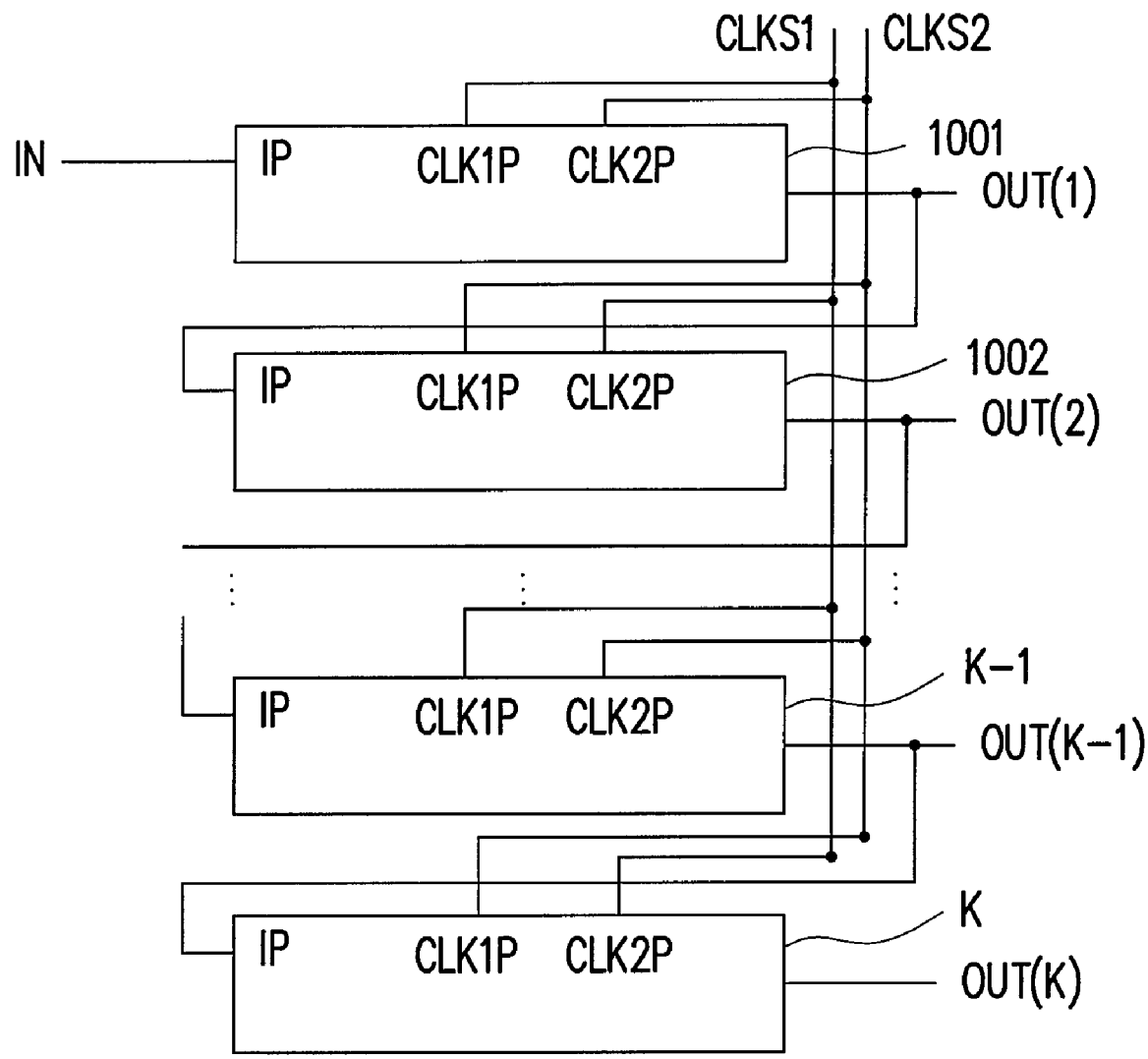
FIG. 10 illustrates a shift register apparatus according to another embodiment of the present invention.

As described above, the shift registers illustrated in FIG. 7 and FIG. 8 may be used for constructing a shift register apparatus. FIG. 10 illustrates a shift register apparatus according to another embodiment of the present invention. Referring to FIG. 10, the shift register apparatus includes shift registers 1001~K, and these shift registers all adopt the structure of shift register illustrated in FIG. 7 or FIG. 8. In FIG. 10, IN represents an input signal, OUT(1)~OUT(K) respectively represent the output signals of the shift registers 1001~K, and CLKS1 and CLKS2 respectively represent two different clock signals. In each shift register, IP represents the input terminal of the circuit in FIG. 7 or FIG. 8 for receiving the input signal IN, CLK1P represents the control terminal of the circuit in FIG. 7 or FIG. 8 for receiving the clock signal CLK1, CLK2P represents the control terminal of the circuit in FIG. 7 or FIG. 8 for receiving the clock signal CLK2, and CLKS1 and CLKS2 are connected to the CLK1P and CLK2P of each shift register in a staggered way.

As shown in FIG. 10, when an input signal IN of high voltage level is input to the $(K-1)^{th}$ shift register, a signal OUT(K-1) of high voltage level is output from the $(K-1)^{th}$ shift register under the functions of the clock signals CLKS1 and CLKS2 after delaying a pulse signal time. Meanwhile, the signal OUT(K-1) becomes the input signal of the $N^{th}$ shift register, and then the signal OUT(K-1) is reset to a low voltage signal by the clock signal CLKS1. Similarly, when an input signal IN of high voltage level is input to the $K^{th}$ shift register, a signal OUT(K) of high voltage level is output from the $K^{th}$ shift register after delaying a pulse signal time, and then the signal OUT(K) is reset to a low voltage level by the clock signal CLKS2.

According to the embodiments described above, a shift register in the present invention has an input unit, an output unit, a reset unit, and a feedback unit, and a shift register apparatus in the present invention is composed of a plurality of foregoing shift registers, wherein the shift register apparatus has two different clock signals CLKS1 and CLKS2 connected in a staggered way and a reset signal RES. While in another embodiment of the present invention, the clock signal CLKS1 may also be used as the reset signal RES for shifting an input signal. Moreover, passive elements are reduced or avoided in the present invention, thus, the size and surface area of the circuit are both reduced, and the product qualified rate is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A shift register, comprising:
   an input unit, receiving an input signal and a first clock signal, and outputting the input signal according to the first clock signal;
   an output unit, receiving a second clock signal and the input signal from the input unit, and outputting the second clock signal to an output terminal according to the input signal;
   a feedback unit, receiving the second clock signal and the input signal from the input unit, and feeding the signal at the output terminal back to the output unit according to the second clock signal; and
   a reset unit, receiving a reset signal, and coupling the output terminal to a low voltage signal according to the reset signal.

2. The shift register according to claim 1, wherein each of the input unit, the output unit, the feedback unit, and the reset unit comprises a first terminal, a second terminal, and a control terminal, and each of the input unit, the output unit, the feedback unit, and the reset unit is turned on or off according to a signal received by the control terminal.

3. The shift register according to claim 1, wherein the first terminal of the input unit is coupled to the input signal, the second terminal of the input unit is coupled to the control terminal of the output unit, and the control terminal of the input unit receives the first clock signal.

4. The shift register according to claim 3, wherein the control terminal of the output unit sustains the voltage of a received signal until the second clock signal is enabled.

5. The shift register according to claim 1, wherein the first terminal of the output unit is coupled to the second clock signal, the second terminal of the output unit is coupled to the output terminal, and the control terminal of the output unit is coupled to the second terminal of the input unit.

6. The shift register according to claim 1, wherein the first terminal of the feedback unit is coupled to the output terminal of the output unit, the second terminal of the feedback unit is coupled to the second terminal of the input unit and the control terminal of the output unit, and the control terminal of the feedback unit is coupled to the second clock signal.

7. The shift register according to claim 1, wherein the first terminal of the reset unit is coupled to the output terminal, the second terminal of the reset unit is coupled to the low voltage signal, and the control terminal of the reset unit is coupled to the reset signal.

8. The shift register according to claim 7, wherein the control terminal of the reset unit receives the reset signal and the reset unit couples the output terminal to the low voltage signal according to the reset signal.

9. The shift register according to claim 8, wherein the reset signal is a clock signal.

10. The shift register according to claim 8, wherein the reset signal is the input signal.

11. The shift register according to claim 8, wherein the reset signal is an output enable (OE) signal.

12. The shift register according to claim 1, wherein the input signal is a pulse signal, the pulse enable durations of the pulse signal and the first clock signal are the same, the pulse enable durations of the first clock signal and the second clock signal are different, and the pulse duration of the reset signal is between the pulse durations of the first clock signal and the second clock signal.

13. The shift register according to claim 11, wherein the duty cycle of the first clock signal is the same as the duty cycle of the second clock signal, the ratio of the pulse width of the reset signal to the pulse width of the first clock signal is smaller than 0.3.

14. The shift register according to claim 1, wherein the input unit, the output unit, the feedback unit, and the reset unit are respectively made of a thin film transistor (TFT), a NMOS, a PMOS, or a BJT.

15. A shift register, comprising:
    a first switch, a second switch, a third switch, and a fourth switch, wherein each switch has a first terminal, a second terminal, and a control terminal;
    an input terminal, connected to the first terminal of the first switch; and
    an output terminal, connected to the first terminal of the second switch, the first terminal of the fourth switch, and the second terminal of the third switch, wherein the second terminal of the first switch, the control terminal of the second switch, and the first terminal of the third switch are connected to each other, the second terminal of the second switch is connected to the control terminal of the third switch, and the control terminal of the first switch is connected to the control terminal of the fourth switch.

16. The shift register according to claim 15, wherein control terminals of the first switch and the fourth switch are coupled to a first signal, and the second terminal of the second switch and the control terminal of the third switch are coupled to a second signal.

17. The shift register according to claim 15, wherein the second terminal of the fourth switch is coupled to a low voltage signal.

18. A shift register apparatus, comprising:
- a first shift register, having a first input terminal, a first output terminal, a first reset terminal, a first control terminal, and a second control terminal; and
- a second shift register, having a second input terminal, a second output terminal, a second reset terminal, a third control terminal, and a fourth control terminal,
- wherein the first output terminal is electrically connected to the second input terminal, the first control terminal and the fourth control terminal are both coupled to a first clock signal, the second control terminal and the third control terminal are both coupled to a second clock signal, and the first reset terminal and the second reset terminal are both coupled to a reset signal.

19. The shift register apparatus according to claim 18, wherein the first shift register comprises:
- an input unit, receiving an input signal and the first clock signal, and outputting the input signal according to the first clock signal;
- an output unit, receiving the second clock signal and the input signal from the input unit, and outputting the second clock signal to an output terminal according to the input signal;
- a feedback unit, receiving the second clock signal and the input signal from the input unit, and feeding the signal at the output terminal back to the output unit according to the second clock signal; and
- a reset unit, receiving the reset signal, and coupling the output terminal to a low voltage signal according to the reset signal.

20. The shift register apparatus according to claim 19, wherein each of the input unit, the output unit, the feedback unit, and the reset unit comprises a first terminal, a second terminal, and a control terminal, and each of the input unit, the output unit, the feedback unit, and the reset unit is turned on or off according to a signal received by the control terminal.

21. The shift register apparatus according to claim 20, wherein the first terminal of the input unit is coupled to the input signal, the second terminal of the input unit is coupled to the control terminal of the output unit, and the control terminal of the input unit receives the first clock signal.

22. The shift register apparatus according to claim 20, wherein the control terminal of the output unit may prolong the voltage of a received control signal until the second clock signal is enabled.

23. The shift register apparatus according to claim 20, wherein the first terminal of the output unit is coupled to the second clock signal, the second terminal of the output unit is coupled to the output terminal, and the control terminal of the output unit is coupled to the second terminal of the input unit.

24. The shift register apparatus according to claim 20, wherein the first terminal of the feedback unit is coupled to the output terminal of the output unit, the second terminal of the feedback unit is coupled to the second terminal of the input unit and the control terminal of the output unit, and the control terminal of the feedback unit receives the second clock signal.

25. The shift register apparatus according to claim 20, wherein the first terminal of the reset unit is coupled to the output terminal of the output unit, the second terminal of the reset unit is coupled to the low voltage signal, and the control terminal of the reset unit receives the reset signal.

26. The shift register apparatus according to claim 25, wherein the control terminal of the reset unit receives the reset signal, and the reset unit couples the second terminal of the output unit to the low voltage signal according to the reset signal.

* * * * *